United States Patent
Chang et al.

(10) Patent No.: US 6,538,086 B1
(45) Date of Patent: Mar. 25, 2003

(54) POLYMER WITH A PERICYCLIC PROTECTIVE GROUP AND RESIST COMPOSITION CONTAINING THE SAME

(75) Inventors: Sheng-Yueh Chang, Taipei Hsien (TW); Bang-Chein Ho, Hsinchu (TW); Jui-Fa Chang, Hsinchu (TW); Jian-Hong Chen, Hsinchu (TW); Ming-Chia Tai, Keelung (TW)

(73) Assignees: Industrial Technology Research Institute, Hsinchu (TW); Everlight Chemical Industrial Corporation, Taipei (TW)

( * ) Notice: Subject to any disclaimer, the term of this patent is extended or adjusted under 35 U.S.C. 154(b) by 0 days.

(21) Appl. No.: 09/514,921

(22) Filed: Feb. 28, 2000

(51) Int. Cl.$^7$ .................................................. C08F 34/02
(52) U.S. Cl. ........................ 526/271; 526/272; 526/281; 430/270.1; 430/905
(58) Field of Search .............................. 430/270.1, 914; 526/280, 281, 271, 272

(56) References Cited

U.S. PATENT DOCUMENTS

| 4,491,628 | A  |   | 1/1985  | Ito et al.      |           |
|-----------|----|---|---------|-----------------|-----------|
| 5,585,223 | A  | * | 12/1996 | Frechet et al.  |           |
| 6,207,342 | B1 | * | 3/2001  | Takechi et al.  | 430/270.1 |
| 6,284,429 | B1 | * | 9/2001  | Kinsho et al.   | 430/270.1 |
| 6,312,867 | B1 | * | 11/2001 | Kinsho et al.   | 430/270.1 |

* cited by examiner

*Primary Examiner*—Rosemary Ashton
(74) *Attorney, Agent, or Firm*—Darby & Darby

(57) ABSTRACT

The present invention relates to a polymer with at least one pericyclic protective group such as 2-methyl-2-bicyclo[2,2,1]heptanyl. The resist composition containing the polymer can be used as a chemically amplified resist and exhibits strong etch resistance. In addition, a line-and-space pattern of 0.1 $\mu$m pitch can be resolved successfully using the resist composition.

2 Claims, No Drawings

POLYMER WITH A PERICYCLIC PROTECTIVE GROUP AND RESIST COMPOSITION CONTAINING THE SAME

BACKGROUND OF THE INVENTION

1. Field of the Invention

The present invention relates to a polymer with at least one pericyclic protective group, and more particularly to a resist composition containing the polymer.

2. Description of the Prior Art

Nowadays, thin film coating technique plays a very important role in chemical engineering technology. A resin suitable for thin film coating should meet the requirements of having good film properties and good adherence to substrates. Therefore, the glass transition temperature of such resin should not be too high. To be considered for application to IC photoresists (resists), a suitable resin should further have other properties such as high etch and heat resistance, properties which are frequently achieved by molecular design.

With increasing integration of semiconductor devices, there is a heightened need to form finer patterns in photolithography processes. A photolithography technology has been proposed which utilizes an ArF excimer laser as a source to generate radiation having a wavelength of 193 nm for producing devices beyond the 1 giga capacity. This technology is intended to replace conventional KrF excimer laser which generates radiation having a wavelength of 248 nm.

A chemically amplified resist composition is a well-known resist composition that is suitable for use in the 193 nm photolithography. The photoresist solution includes a protected resin, a photoacid generator, and a solvent. The so-called protected resin is a resin that is protected by an acid-labile protective group. The resin will be converted into alkali-soluble when the acid-labile protective group is decomposed. When a positive chemically amplified resist composition applied on a substrate is exposed to light, the photoacid generator will generate acid, and the acid will decompose the acid-labile protective group in the resin, thus making the resin soluble in an alkali developer.

Ito et al. in U.S. Pat. No. 4,491,628 discloses a resist composition in which the resin is protected by t-butyl esters of carboxylic acid. The examples of such protected resins include poly(tert-butyl p-vinylbenzoate) and poly(tert-butyl methacrylate). However, such a resist composition has an insufficient etch resistance and resolution. Moreover, post exposure baking (PEB) should be conducted at a high temperature, so that the integrated circuits are easily degraded, and problems such as proximity effect (isoline and denseline bias) and edge roughness are thus induced.

SUMMARY OF THE INVENTION

Therefore, an object of the present invention is to solve the above-mentioned problems and to provide a novel polymer that exhibits strong etch resistance.

Another object of the present invention is to provide a novel polymer that has the required properties for use in chemically amplified resist for use with ArF laser.

A further object of the present invention is to provide a photoresist composition comprising the novel polymer, which can be post exposure baked at a lower temperature. Thus, problems of the proximity and edge roughness can be solved.

To achieve the above objects, the present invention provides a polymer containing at least one pericyclic protective group G having a formula selected from the group consisting of:

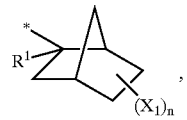 (I)

 (II)

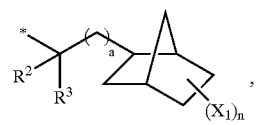 (III)

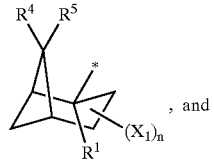 (IV)

, and

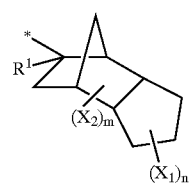 (V)

wherein
$R^1$ is selected from the group consisting of linear or branched alkyl, alkenyl, alkylaryl, arylalkyl having from 1 to 10 carbon atoms, cyclic alkyl having from 3 to 15 carbon atoms, alkoxyl having from 1 to 10 carbon atoms, and

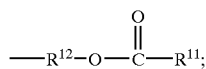

$R^2$, $R^3$, $R^4$, and $R^5$ can be the same or different and are independently selected from the group consisting of hydrogen, linear or branched alkyl, alkenyl, alkylaryl, arylalkyl having from 1 to 10 carbon atoms, cyclic alkyl having from 3 to 15 carbon atoms, alkoxyl having from 1 to 10 carbon atoms, and

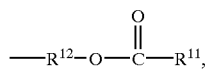

wherein $R^{11}$ is selected from the group consisting of hydrogen, linear or branched alkyl, alkenyl, alkylaryl, arylalkyl having from 1 to 10 carbon atoms, cyclic alkyl having from 3 to 15 carbon atoms, alkoxyl having from 1 to 10 carbon atoms, arid $R^{12}$ is an alkylene group having from 1 to 10 carbon atoms;

$X_1$ and $X_2$ can be the same or different and are independently selected from the group consisting of a halogen, hydroxy, $C_{1-15}$ alkoxy, $NH_2$, $NHR^{61}$, $NR^{61}R^{62}$, SH, $SR^{63}$, —(C=O)H, —(C=O)OH, —(O=O)$R^{64}$, —(C=O)O$R^{65}$, each of $R^{61}$, $R^{62}$, $R^{63}$, $R^{64}$, and $R^{65}$ being linear or branched alkyl having from 1 to 10 carbon atoms or cyclic alkyl having from 3 to 15 carbon atoms;

n, which denotes the degree of substitution of the ring to which $X_1$ is attached, is from 0 to 5;

m, which denotes the degree of substitution of the ring to which $X_2$ is attached, is from 0 to 5;

a is from 1 to 5; and in formula (III), when one of $R^2$ and $R^3$ is hydrogen, $R^2$ and $R^3$ are different.

DETAILED DESCRIPTION OF THE INVENTION

A first aspect of the present invention is that it provides a novel polymer containing at least one pericyclic protective group G selected from formulae (I) to (V). That is to say, the polymer may contain only one group G, two groups G, three groups C, four groups G, or even five groups G. The combination of the groups G is not limited.

In formulae (I) to (V), $R^1$ is selected from the group consisting of linear or branched alkyl, alkenyl, alkylaryl, arylalkyl having from 1 to 10 carbon atoms, cyclic alkyl having from 3 to 15 carbon atoms, alkoxyl having from 1 to 10 carbon atoms, and

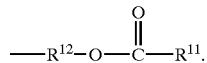

$R^2$, $R^3$, $R^4$, and $R^5$ can be the same or different and are independently selected from the group consisting of hydrogen, linear or branched alkyl, alkenyl, alkylaryl, arylalkyl having from 1 to 10 carbon atoms, cyclic alkyl having from 3 to 15 carbon atoms, alkoxyl having from 1 to 10 carbon atoms, and

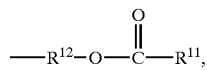

wherein $R^{11}$ is selected from the group consisting of hydrogen, linear or branched alkyl, alkenyl, alkylaryl, arylalkyl having from 1 to 10 carbon atoms, cyclic alkyl having from 3 to 15 carbon atoms, alkoxyl having from 1 to 10 carbon atoms, and $R^{12}$ is an alkylene group having from 1 to 10 carbon atoms.

Representative examples of $R^1$, $R^2$, $R^3$, $R^4$, and $R^5$ include hydrogen, methyl, ethyl, propyl, butyl, isobutyl, amyl, isoamyl, hexyl, 2-ethylhexyl, heptyl, octyl, vinyl, allyl, phenyl, and tosyl. But $R^1$ can not be hydrogen.

$X_1$ and $X_2$ can be the same or different and are independently selected from the group consisting of halogen, hydroxy, $C_{1-15}$ alkoxy, $NH_2$, $NHR^{61}$, $NR^{61}R^{62}$, SH, $SR^{63}$, —(C=O)H, —(C=O) OH, —(C=O)$R^{64}$, —(C=O)O$R^{65}$ each of $R^{61}$, $R^{62}$, $R^{63}$, $R^{64}$, and $R^{65}$ being linear or branched alkyl having from 1 to 10 carbon atoms or cyclic alkyl having from 3 to 15 carbon atoms.

Representative examples of $X_1$ and $X_2$ include fluorine, chlorine, hydroxy, methoxy, ethoxy, —$NH_2$, —$N(CH_3)_2$, —SH, —$SCH_3$, —(C=O)H, —(C=O)OH, —(CO)$CH_3$, —(C=O) O$CH_3$, and —(C=O)OC$(CH_3)_3$ (t-butyloxycarbonyl).

When the polymer of the present invention contains a pericyclic protective group of formula (I) and n is 1, then preferably $X_1$ is t-butyloxycarbonyl, and $R^1$ is alkyl having from 1 to 10 carbon atoms, preferably methyl.

When the polymer of the present invention contains a pericyclic protective group of formula (I) and n is 0, then preferably $R^1$ is alkyl having from 1 to 10 carbon atoms, preferably methyl.

When the polymer of the present invention contains a pericyclic protective group of formula (I) and n is 3, then preferably two $X_1$ are halogen groups, and one $X_1$ is OH.

According to the present invention, the polymer can be a homopolymer or a copolymer containing at least one pericyclic protective group G as defined above. When the polymer of the present invention is a copolymer, one example can be a block or random copolymer having the repeating units (VI), (VII), (VIII), (IX), and (X):

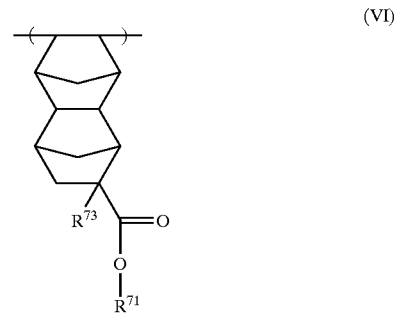

(VI)

(VII)

(VIII)

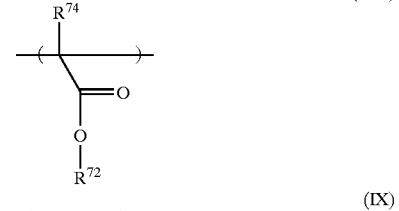

(IX)

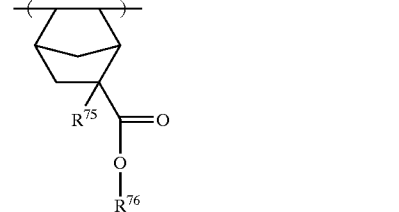

(X)

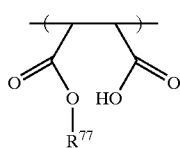

wherein $R^{71}$, $R^{72}$, and $R^{76}$ can be the same or different and are independently hydrogen, linear or branched alkyl having from 1 to 10 carbon atoms or cyclic alkyl having from 3 to 15 carbon atoms, provided that at least one of $R^{71}$, $R^{72}$, and $R^{76}$ is a pericyclic protective group G;

$R^{73}$, $R^{74}$, $R^{75}$, and $R^{77}$ are the same or different and are independently hydrogen, linear or branched alkyl having from 1 to 10 carbon atoms or cyclic alkyl having from 3 to 15 carbon atoms; and the molar ratios of the repeating units (VI), (VII), (VIII), (IX) and (X) are w, x, y, z, and s respectively, wherein w+x+y+z+s=1, 0.8≧w≧0, 0.5≧x≧0, 0.8≧y≧0.1, 0.5≧z>0, 0.2≧s≧0.

When z and w are larger than 0, at least one of $R^{71}$, $R^{72}$, and $R^{76}$ is a pericyclic protective group G. When z and w are both equal to 0, $R^{72}$ is a pericyclic protective group G. When z=0 and w>0, at least one of $R^{71}$ and $R^{72}$ is a pericyclic protective group G. When w=0 and z>0, at least one of $R^{72}$ and $R^{76}$ is a pericyclic protective group G.

When z=0 and w>0, at least one of $R^{71}$ and $R^{72}$ is a pericyclic protective group G as defined above, and the other is preferably an acid-labile protective group. Similarly, when w=0 and z>0, at least one of $R^{72}$ and $R^{76}$ is a pericyclic protective group G as defined above, and the other is preferably an acid-labile protective group. Thus, such a polymer can be used as a chemically amplified resist. The acid-labile protective group will be decomposed in the presence of an acid, so as to make the polymer alkali-soluble.

When z and w are both larger than 0, among $R^{71}$, $R^{72}$, and $R^{76}$, at least one is a pericyclic protective group G as defined above and the other one or the other two are preferably acid-labile protective groups. Thus, such a polymer can be used as a chemically amplified resist.

When w, x and z are larger than 0 and s is equal to 0, an example of such a copolymer is that $R^{71}$ is tert-butyl, $R^{73}$ is hydrogen, $R^{74}$ and $R^{75}$ are methyl, $R^{74}$ and $R^{76}$ are pericyclic protective groups represented by formula (I). Preferably, $R^{72}$ and $R^{76}$ are 2-methyl-2-bicyclo[2,2,1]heptanyl.

To make the polymer of the present invention suitable for thin film coating, the polymer is preferably soluble in an organic solvent. A preferable polymer of the present invention has a glass; transition temperature (Tg) higher khan 100° C., preferably 130° C. to 300° C., a weight average molecular weight of 300 to 50000, and a decomposition temperature (Td) higher than 130° C., preferably 160° C.

A second aspect of the present invention is that it provides a resist composition containing at least one polymer of the present invention described above and a photoacid generator, wherein the photoacid generator is present in an amount of from 1 to 20% by weight of the polymer.

Any suitable photoacid generator may be used. Preferred photoacid generators include, but are not limited to, triarylsulfonium salts, diaryliodonium salts, sulfonates, and mixtures thereof. Representative examples of the triarylsulfonium salts include triphenyltriflate, triphenylantimonate, methoxytriphenyltriflate, methoxytriphenylantimonate, trimethyltriphenyltriflate, and naphthalenetriflate. Representative examples of the diaryliodonium salts include diphenyliodoniumtriflate, di-t-butylbisphenyl-antimonate, and di-t-butylbisphenyltriflate.

The resist composition of the present invention is photosensitive at a wavelength of 150 nm to 650 nm, preferably at a wavelength of 193 nm or 248 nm.

The following examples are intended to illustrate the process and the advantages of the present invention more fully without limiting its scope, since numerous modifications and variations will be apparent to those skilled in the art.

SYNTHESIS OF MONOMERS

Example 1-1

165 g of 2-norbornone, 134.1 g of methyl magnesium chloride, and 300 ml of THF (tetrahydrofuran) were charged in a reaction vessel and stirred for 18 hours. The reaction solution was poured into a mixed solution of 1500 ml of ether and 1500 ml of water for extraction. The extract solution was concentrated under reduced pressure to give 173.8 g of 2-methyl-2-norbornol. The conversion rate was 92%. 176 g of the obtained 2-methyl-2-norbornol, 175.5 g of methacrylyl chloride, 500 ml of dichloromethane, and 186.6 g of triethylamine were charged in a reaction vessel and stirred for 18 hours. The reaction solution was poured into a mixed solution of 1500 ml of ether and 1500 ml of water for extraction. The extract solution was concentrated under reduced pressure, separated and decolored by column chromatography (the packing material was silica gel, the eluent was hexane). The solution was then concentrated under reduced pressure to afford 2-methyl-2-norbornyl-methacrylate. The conversion was 77%.

Example 1-2

The procedures as described in Example 1-1 were employed except that methacrylyl chloride was replaced with 1.8 mole of acrylyl chloride. The reaction product was 2-methyl-2-norbornyl-acrylate.

Example 1-3

110 g of 2-norbornoner 77.8 g of methyl magnesium chloride, and 300 ml of THF were charged in a reaction vessel and stirred for 3 hours. 156 g of norbornenyl carboxyl chloride was charged in the vessel and the mixture was stirred for 18 hours. The reaction solution was poured into a mixed solution of 1500 ml of ether and 1500 ml of water for extraction. The extract solution was concentrated under reduced pressure, separated and decolored by column chromatography (the packing material was silica gel, the eluent was hexane). The solution was then concentrated under reduced pressure to afford 2-methyl-2-norbornyl-norbornene carboxylate. The conversion was 84.6%.

Example 1-4

400 g of methyl dinorbornene carboxylate, 480 g of 17 wt% sodium hydroxide solution, and 400 ml of THF were charged in a reaction vessel and refluxed for 24 hours. 800 ml of n-hexane was poured into the vessel, and the water layer was collected. Hydrogen chloride solution was added to the water layer for acidification until precipitation occurred. The precipitates were dissolved in ether and concentrated under reduced pressure to afford dinorbornene carboxylic acid as a white solid. The conversion rate was 83.8%.

102 g of the obtained dinorbornene carboxylic acid and 300 ml of THF were charged in a reaction vessel. 315 g of trifluoroacetic anhydride, 133.2 g of tert-butanol, 125 g of ammonium hydroxide were added to the vessel under an ice bath and stirred for 12 hours. Then, the reaction solution was extracted with 1000 ml or ether, washed twice with water, and concentrated under reduced pressure to afford t-butyl dinorbornene carboxylate as a pale yellow liquid. The conversion rate was 86%.

SYNTHESIS OF POLYMERS

Example 2-1

26 g of t-butyl dinorbornene carboxylate, 19.6 g of maleic anhydride, 38.8 g of 2-methyl-2-norbornyl-methacrylate, 24.6 g of 2-methyl-2-norbornyl-norbornene carboxylate, 10.9 g of v-601 (dimethyl 2,2'-azobisisobutyrate), 190.8 g of THF were charged in a reaction vessel and refluxed for 10 hours. The reaction solution was poured in a mixed solution of 1000 ml of n-hexane and 1000 ml of isopropanol to form precipitates. The reaction mixture was then filtered and dried to afford 55.8 g of a copolymer as a white solid. The Tg (glass transition temperature) of the copolymer (resin) was 155° C. (analyzed by DSC), the Td (decomposition temperature) was 223° C. (analyzed by TGA), the weight-average molecular weight was 5260 (analyzed by GPC), and the conversion rate was 51.18%.

Examples 2-2 to 2-10

The same procedures as described in Example 2-1 were employed, except that the reactants were changed according to Table 1. The results are also shown in Table 1.

TABLE 1

| Reatants (g) | Example | | | | | | | | | |
|---|---|---|---|---|---|---|---|---|---|---|
| | 2-1 | 2-2 | 2-3 | 2-4 | 2-5 | 2-6 | 2-7 | 2-8 | 2-9 | 2-10 |
| MA | 19.6 | 19.6 | 19.6 | 32.3 | 32.3 | 34.3 | 34.3 | 19.6 | 19.6 | 19.6 |
| NORMA | 38.8 | — | — | — | 65.9 | 29.1 | 38.8 | — | 38.8 | — |
| NORA | — | — | — | 61.2 | — | — | — | 36 | — | 36 |
| NONB | 24.6 | 49.6 | 49.6 | 81.2 | 81.2 | 86.1 | 86.1 | — | — | 24.6 |
| TBNB | — | — | — | — | — | — | — | — | — | — |
| TBMA | — | — | 28.4 | — | — | — | — | — | — | — |
| DTBNB | 26 | — | — | — | — | — | — | 52 | 52 | 26 |
| IBMA | — | — | — | — | — | 44.4 | 33.3 | — | — | — |
| V-601 | 10.9 | 6.92 | 9.76 | 17.47 | 17.9 | 19.4 | 19.3 | 10.7 | 11.0 | 10.6 |
| THF | 190.8 | 69.2 | 97.6 | 174.7 | 179.4 | 194 | 193 | 107 | 110 | 106 |
| Td (° C.) | 223 | 226 | 196 | 229 | 247 | 224 | 221 | 227 | 213 | 236 |
| Tg (° C.) | 155 | 166 | 146 | 156 | 174 | 164 | 153 | 181 | 184 | 146 |
| Mw | 5260 | 2700 | 7200 | 5012 | 4120 | 5700 | 5200 | 4100 | 5500 | 3500 |

MA: maleic anhydride
NORMA: 2-methyl-2-norbornyl-methacrylate
NORA: 2-methyl-2-norbornyl-acrylate
NONB: 2-methyl-norbornyl-norbornene carboxylate
TBNB: t-butyl norbornene carboxylate
TBMA: t-butyl methacrylate
DTBNB: t-butyl dinorbornene carboxylate
TBMA: isobornyl methacrylate

PREPARATION OF RESISTS

Example 3-1

3 g of the resin obtained from Example 2-1, 0.075 g of triphenylsulfonium nonafluorosulfate (PAG; photoacid generator), 1.71 g of 1-piperidinyl ethanol (killer base), and 0.15 g of t-butyl cholate (additive) were dissolved in 15.1 g of propylene glycol methyl ether acetate (PGMEA) and stirred for 12 hours. The mixture was filtered through a 0.4 μm filter. The filtrate was applied to an 8 inch wafer by spin coating at 2000 rpm and soft baked at 140° C. The film thickness was measured by Nanospec to as 4850±25Å, indicating that the film properties are good.

Examples 3-2 to 3-15

The same procedures as described in Example 3-1 were employed except that the resin used was changed according to Table 2.

TABLE 2

| Example | Polymer (20 wt % based on solvent) | PAG | Killer base | Additive | Film Thickness (Å) |
|---|---|---|---|---|---|
| 3-2 | Example 2-2 | | | | 3798 |
| 3-3 | Example 2-3 | | | | 4766 |
| 3-4 | Example 2-4 | | | | 5031 |
| 3-5 | Example 2-5 | | | | 6374 |
| 3-6 | Example 2-6 | | | | 5031 |
| 3-7 | Example 2-7 | | | | 4949 |
| 3-8 | Example 2-8 | | | | 4314 |
| 3-9 | Example 2-9 | | | | 5044 |
| 3-10 | Example 2-10 | 2.5 wt % of polymer | 10 mole % of PAG | 5 wt % of polymer | 4513 |
| | Example 2-1 (10 wt %) | | | | 4899 |
| 3-11 | Example 2-7 (10 wt %) | | | | |
| 3-12 | Example 2-1 (10 wt %) Example 2-6 (10 wt %) | | | | 4707 |
| 3-13 | Example 2-10 (10 wt %) Example 2-7 (10 wt %) | | | | 4785 |
| 3-14 | Example 2-10 (10 wt %) Example 2-6 (10 wt %) | | | | 4872 |
| 3-15 | Example 2-6 (10 wt %) Example 2-8 (10 wt %) | | | | 4916 |

PAG: triphenylsulfonium nonafluorosulfate
Killer base: 1-piperidinyl ethanol
Additive: t-butyl cholate

EVALUATION OF THE RESISTS

Example 4-1

The coated wafer of Example 3-1 was irradiated through a mask using a 193 nm excimer laser, and the irradiation dosage was 5, 5.5, 6, 6.5, 7, 7.5, 8, 8.5, 9, 9.5, 10, 10.5, 11, 11.5, 12 . . . mj/cm$^2$, respectively. After exposure, the wafer was baked at 130° C. for 90 sec, and then developed for 1 minute using 2.38% tetramethyl ammonium hydroxide (TMAH) solution. The wafer was then rinsed with distilled water for seconds and dried to form resist patterns. It was confirmed by SEM that a line-and-space pattern of 0.1 μm pitch is resolved successfully.

Example 4-2

The coated wafer of Apex-E, Examples 3-2, 3-4, 3-5, and 3-8 were etched by LAM TCP 9400 etcher under the etching condition of 300 W Chuck Power/150 SCCM HBr/50 SCCM Cl$_2$. The etching rate of Apex-E, the photoresists of Examples 3-2, 3-4, 3-5 and 3-8 was measured to be 1171, 905, 895, 1041, and 1050 Å/min respectively. It can be found that the etching rate of the photoresists of Examples 3-2, 3-4, 3-5 and 3-8 are lower than that of Apex-E. This indicates that the photoresist of the present invention exhibits better etch resistance than the conventional photoresist.

What is claimed is:

1. A polymer which is a block or random copolymer comprising the repeating units (VI), (VII), (VIII), (IX), and (X):

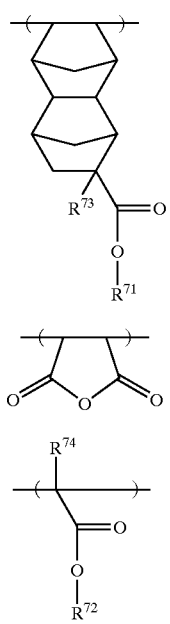

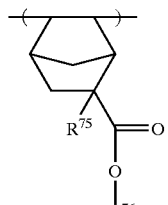

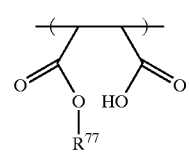

wherein $R^{71}$ is tert-butyl, $R^{73}$ is hydrogen, $R^{74}$ and $R^{75}$ are methyl, $R^{72}$ and $R^{76}$ are pericyclic protective groups G, $R^{77}$ is hydrogen, linear or branched alkyl having from 1–10 carbon atoms or cyclic alkyl having from 3 to 15 carbon atoms; and the molar ratios of the repeating units (VI), (VII), (VIII), (IX) and (X) are w, x, y, z, and s respectively, wherein w+x+y+z+s=1, $0.8 \geq w > 0$, $0.5 \geq x > 0$, $0.8 \geq y \geq 0.1$, $0.5 \geq z > 0$, and s=0.

2. The polymer of claim 1, wherein $R^{72}$ and $R^{76}$ are 2-methyl-2-bicyclo[2,2,1]heptanyl.

* * * * *